US008587982B2

(12) United States Patent
Kim et al.

(10) Patent No.: US 8,587,982 B2
(45) Date of Patent: Nov. 19, 2013

(54) NON-VOLATILE MEMORY ARRAY CONFIGURABLE FOR HIGH PERFORMANCE AND HIGH DENSITY

(75) Inventors: Jung Pill Kim, San Diego, CA (US); Hari M. Rao, San Diego, CA (US); Xiaochun Zhu, San Diego, CA (US); Xia Li, San Diego, CA (US); Seung H. Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 94 days.

(21) Appl. No.: 13/034,763

(22) Filed: Feb. 25, 2011

(65) Prior Publication Data

US 2012/0218805 A1  Aug. 30, 2012

(51) Int. Cl.
*G11C 5/06* (2006.01)

(52) U.S. Cl.
USPC ............... 365/63; 365/66; 365/158; 365/187

(58) Field of Classification Search
USPC ............. 365/63 O, 66 X, 158 X, 163, 187 X
See application file for complete search history.

(56) References Cited

U.S. PATENT DOCUMENTS

| 7,095,647 | B1 * | 8/2006 | Jenne et al. | 365/158 |
| 7,505,307 | B2 * | 3/2009 | Ueda | 365/158 |
| 8,174,874 | B2 * | 5/2012 | Inaba | 365/158 |
| 8,233,316 | B2 * | 7/2012 | Liu | 365/163 |
| 2005/0157541 | A1 | 7/2005 | Iwata | |
| 2005/0276098 | A1 | 12/2005 | Yang et al. | |
| 2008/0316798 | A1 * | 12/2008 | Tanizaki et al. | 365/148 |
| 2009/0161413 | A1 | 6/2009 | Yoon et al. | |
| 2010/0188894 | A1 | 7/2010 | Rao et al. | |

OTHER PUBLICATIONS

International Search Report and Written Opinion—PCT/US2012/026832—ISA/EPO—Jul. 16, 2012.
M. Hosomi, et al., A Novel Nonvolatile Memory with Spin Transfer Torque Magnetoresistive Magnetization Switching: Spin-RAM, proceedings of IEDM conference (2005).

* cited by examiner

*Primary Examiner* — Vanthu Nguyen
(74) *Attorney, Agent, or Firm* — Sam Talpalatsky; Nicholas J. Pauley; Joseph Agusta

(57) ABSTRACT

Embodiments include a memory array having a plurality of bit lines and a plurality of source lines disposed in columns. A plurality of word lines is disposed in rows. A plurality of storage elements have a first subset of storage elements electrically decoupled from the memory array and a second subset of storage elements coupled to the memory array. The memory array further includes a plurality of bit cells, each including one storage element from the second subset of storage elements coupled to at least two transistors. The bit cells are coupled to the plurality of bit lines and the plurality source lines. Each transistor is coupled to one word line. The memory array can further include logic to select a high performance mode and a high density mode.

12 Claims, 8 Drawing Sheets

NON-VOLATILE MEMORY ARRAY CONFIGURABLE FOR HIGH PERFORMANCE AND HIGH DENSITY

FIELD OF DISCLOSURE

Disclosed embodiments are related to non-volatile memory such as Spin Transfer Torque Magnetoresistive Random Access Memory (STT-MRAM) arrays and techniques for configuring the same, to operate in different modes such as high performance mode and high density mode.

BACKGROUND

Magnetoresistive Random Access Memory (MRAM) is a non-volatile memory technology that uses magnetic elements. For example. Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM).

FIG. 1 illustrates a conventional STT-MRAM bit cell 100. The STT-MRAM bit cell 100 includes magnetic tunnel junction (MTJ) storage element 105, a MOS transistor 101, a bit line 102, source line 104 and a word line 103. The MTJ storage element is formed, for example, from at least two ferromagnetic layers (a pinned layer and a free layer), each of which can hold a magnetic field or polarization, separated by a thin non-magnetic insulating layer (tunneling barrier). Electrons from the two ferromagnetic layers can penetrate through the tunneling barrier due to a tunneling effect under a bias voltage applied to the ferromagnetic layers.

The magnetic polarization of the free layer can be reversed so that the polarity of the pinned layer and the free layer are either substantially aligned (parallel) or opposite (anti-parallel). The resistance of the electrical path through the MTJ will vary depending on the alignment of the polarizations of the pinned and free layers. This variance in resistance can be used to read the STT-MRAM bit cell 100. The STT-MRAM bit cell 100 also includes a sense amplifier 108, read/write circuitry 106 and a bit line reference 107. The operation and construction of the STT-MRAM bit cell 100 is known in the art and will not be discussed in detail herein. Additional details are provided, for example, in M. Hosomi, et al. A Novel Nonvolatile Memory with Spin Transfer Torque Magnetization Switching: Spin-RAM, proceedings of IEDM conference (2005), which is incorporated herein by reference in its entirety.

The STT-MRAM bit cell 100 may be programmed such that a binary value "0" is associated with an operational state wherein the polarity of the free layer is parallel to the polarity of the pinned layer. Correspondingly, a binary value "1" may be associated with an anti-parallel orientation between the two ferromagnetic layers. A binary value may thus be written to the bit cell by changing the polarization of the free layer. A sufficient current density (typically measured in Amperes/centimeter$^2$) generated by the electrons flowing across the tunneling barrier is required to change the polarization of the free layer. Supply of current to the MTJ storage element 105 is controlled by the MOS transistor 101. Decreasing the resistance path through the MOS transistor 101, contributes to increasing the current supplied to the MTJ storage element 105 which leads to higher performance.

However, techniques to fabricate low resistance MOS transistors may involve increasing the area of the MOS transistors. The area of the STT-MRAM bit cell 100 is largely dependent on the area of the MOS transistor 101, because the area of the MTJ storage element 105 is very small in comparison. Hence, increasing the area of the MOS transistor 101 leads to a corresponding increase in the area of the STT-MRAM bit cell 100, which in turn leads to a lower number of STT-MRAM bit cell 100 per unit area of a memory array formed from STT-MRAM bit cells.

Accordingly, the area of the MOS transistor is a key parameter in the design and development of STT-MRAM arrays. High density STT-MRAM architectures may compromise on performance to pack more STT-MRAM bit cell 100 per unit area by decreasing the area of the MOS transistor 101.

On the other hand, high performance architectures, which require a greater supply of current to the MTJ storage element 105, may compromise on density by increasing the area of the MOS transistor 101. Alternately, the memory array may be designed such that an STT-MRAM bit cell may include a plurality of MOS transistors connected in parallel, driving a single MTJ storage element. Such arrangements with "n" transistors driving 1 MTJ storage element are commonly referred to as "nT-1MTJ" architectures.

It is difficult to control the size of the transistors with precision, during the initial development phase of such memory arrays. Further, test chips may require different fabrication databases to test memory architectures designed for high performance and memory architectures designed for high density. More particularly, conventional techniques require different databases for high density STT-MRAM bit cells with a single MOS transistor 101 and single MTJ storage element 105 (1T-1MTJ), and high performance STT-MRAM bit cells with nT-1MTJ architectures.

SUMMARY

Exemplary embodiments can include a memory array comprising: a plurality of bit lines and a plurality of source lines disposed in columns; a plurality of word lines disposed in rows; a plurality of storage elements having a first subset of storage elements electrically decoupled from the memory array and a second subset of storage elements coupled to the memory array; and a plurality of bit cells, each bit cell including one storage element from the second subset of storage elements coupled to at least two transistors, wherein the plurality of bit cells are coupled to the plurality of bit lines and the plurality source lines, and wherein each transistor is coupled to one word line.

Another embodiment can include a method of testing a memory array comprising: selecting a high performance mode; activating a first word line and a second word line from a single word line control signal, wherein the first word line is coupled to a first transistor and the second word line is coupled to a second transistor, each transistor being coupled to a storage element; and selecting a bit line and a source line coupled to a bit cell, the bit cell including the storage element and the first transistor and the second transistor.

Another embodiment can include a memory array comprising: means for selecting a high performance mode; means for activating a first word line and a second word line from a single word line control signal, wherein the first word line is coupled to a first transistor and the second word line is coupled to a second transistor, each transistor being coupled to a storage element; and means for selecting a bit line and a source line coupled to a bit cell including the storage element and the first transistor and the second transistor.

Another embodiment can include a method of testing a memory array comprising: step for selecting a high performance mode; step for activating a first word line and a second word line from a single word line control signal, wherein the first word line is coupled to a first transistor and the second word line is coupled to a second transistor, each transistor being coupled to a storage element; and step for selecting a bit line and a source line coupled to a bit cell including the storage element and the first transistor and the second transistor.

Another embodiment can include a method of testing a memory array comprising: selecting a high performance mode; coupling at least two bit lines and at least two source lines of adjacent columns to a common bit line and a common source line, respectively; and activating a word line coupled to a bit cell, the bit cell having at least two transistors coupled to the word line, wherein each transistor is coupled to one of the at least two source lines and a storage element, and wherein the storage element is coupled to the at least two bit lines.

Another embodiment can include a method of forming a memory array, the method comprising: disposing a plurality of word lines in rows; disposing a plurality of bit lines and a plurality source lines in columns substantially perpendicular to the rows; forming a plurality of storage elements having a first subset of storage elements and a second subset of storage elements; electrically decoupling the first subset of storage elements from the memory array; and forming a plurality of bit cells, each bit cell being formed by coupling at least two transistors to one storage element from the second subset of storage elements, wherein the plurality of bit cells are coupled to the plurality of bit lines and source lines, and wherein each transistor is coupled to one word line.

BRIEF DESCRIPTION OF THE DRAWINGS

The accompanying drawings are presented to aid in the description of the various embodiments and are provided solely for illustration of the embodiments and not limitation thereof.

DETAILED DESCRIPTION

Aspects of the various embodiments are disclosed in the following description and related drawings directed to specific embodiments. Alternate embodiments may be devised without departing from the scope of the various embodiments. Additionally, well-known elements of the various embodiments will not be described in detail or will be omitted so as not to obscure the relevant details of the various embodiments.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation. The terminology used herein is for the purpose of describing particular embodiments only and is not intended to be limiting of the various embodiments as disclosed and defined by the appended claims.

As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The disclosed embodiments provide techniques, wherein 1T-1MTJ and nT-1MTJ architectures may be created from a single database. Exemplary embodiments may be beneficially employed in the design, development and testing of STT-MRAM arrays for different design points such as high density (HD) and high performance (HP). A value of n=2 has been employed to describe 2T-1MTJ structures in illustrative embodiments. However, it will be understood that the inventive techniques in this disclosure may be easily expanded to larger integer values of n.

Figure 1:
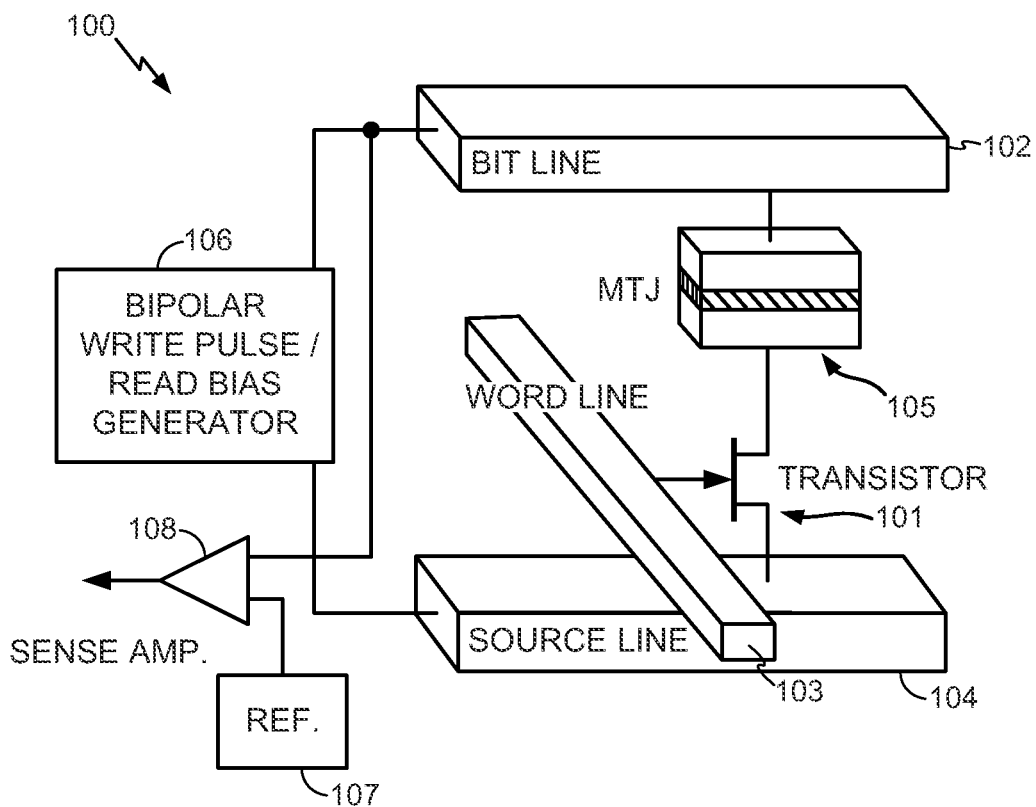
FIG. 1 illustrates a bit cell of a Spin Transfer Torque Magnetoresistive Random Access Memory (STT-MRAM).
Figure 2:
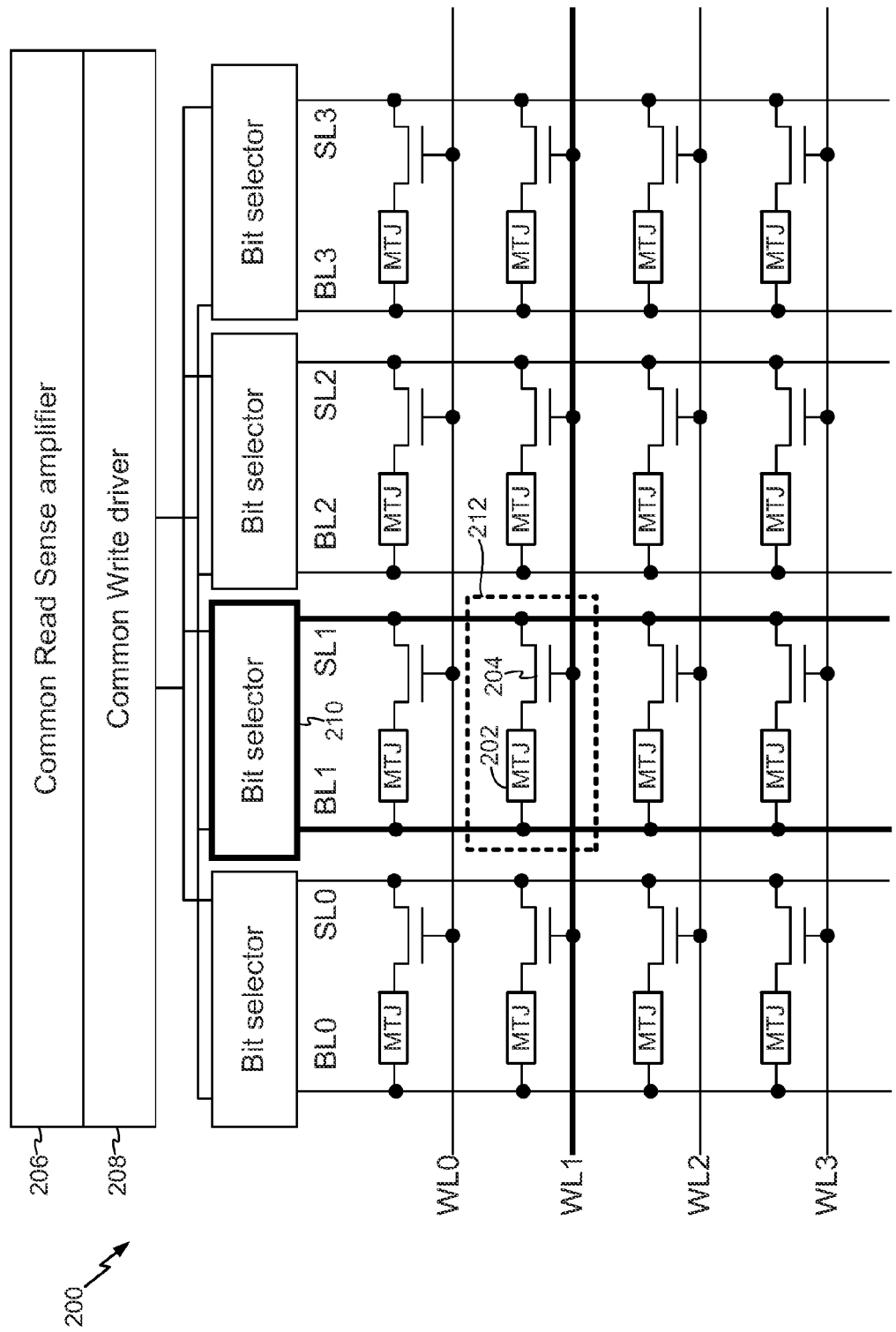
FIG. 2 is a conventional 4×4 STT-MRAM array with 16 STT-MRAM bit cells disposed along 4 rows and 4 columns, and configured to operate in a high density mode.

FIG. 2 shows a conventional 1T-1MTJ 4×4 memory array 200 with 16 STT-MRAM bit cells, disposed along 4 rows and 4 columns. Each STT-MRAM bit cell includes 1 MTJ storage element and 1 transistor. The transistor in this illustration is an n-channel Metal Oxide Semiconductor (NMOS) transistor. Other well known transistors may be employed in place of the NMOS transistor in the construction of similar STT-MRAM bit cells. WL0, WL1, WL2, WL3 are word lines (such as word line 103 in FIG. 1), BL0, BL1, BL2, BL3 are bit lines (such as bit line 102 in FIG. 1) and SL0, SL1, SL2, SL3 are source lines (such as source line 104 in FIG. 1). An exemplary STT-MRAM bit cell 212, which is highlighted in FIG. 2, includes an MTJ storage element 202 and NNAOS transistor 204. Common read sense amplifier 206 and common write driver 208 are also illustrated.

Read and write operations may be performed on memory array 200 using conventional techniques. For example, when a write operation is attempted to bit cell 212, an address decoder (not shown), activates the word line WL1 corresponding to the address of bit cell 212. The common write driver 208 provides write data through bit selector 210 to drive bit line BL1 and source line SL1. Bit selector 210 will be selected by one of two column addresses in this example. Depending on current direction through MTJ 202 and cell 212 a binary value of "0" or "1" is written to the MTJ storage element 202.

For a read operation, a small current flows through BL1, MTJ storage element 202 and SL1. The output voltage level during a read operation depends on the data value stored in MTJ storage element 202, and is provided to the common read sense amplifiers 206, which compare the output voltage level with a reference voltage level in order to determine the stored data value.

As described previously, the resistance through the NMOS transistor 204 is very high, e.g., on the order of a few kilo-ohms. This high resistance path is disadvantageous to HP applications which require faster switching activity in the MTJ storage element 202. Hence, introducing a second NMOS transistor of equal resistance in parallel with NMOS transistor 204 can effectively reduce the resistance in the current path to the MTJ storage element 202 by approximately half. It will be readily understood that "n" such transistors may be connected in parallel to effectively reduce the resistance to approximately 1/n of the resistance of a single transistor (nT-1MTJ).

However, adding more transistors to an STT-MRAM bit cell 212 has the adverse effect of a proportional increase in its area. HD applications, which typically trade performance for area, will be severely burdened by any increase in the number of MOS transistors. Hence, in the development phase of an STT-MRAM memory array, the test chip may use different databases for HD and HP applications using conventional techniques.

Figure 3:
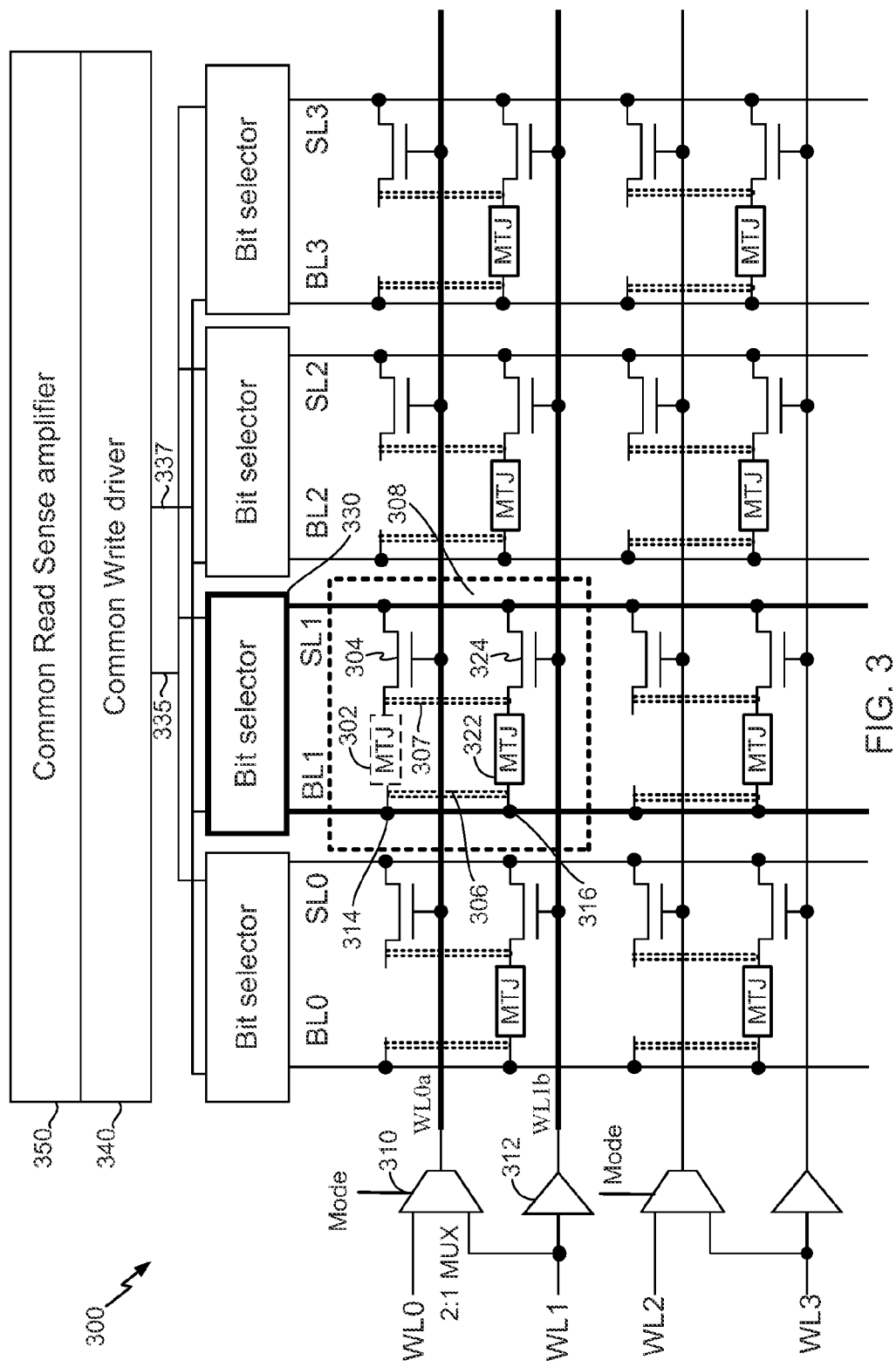
FIG. 3 is a 2×4 STT-MRAM array with 8 STT-MRAM bit cells disposed along 2 rows and 4 columns, and configured to operate in a high performance mode.

FIG. 3 illustrates an exemplary embodiment wherein a metal or via contact option change can transform a test chip/memory array configured for HD applications into a test chip/memory array configured for HP applications. Memory array 300 is laid out in a similar manner to conventional memory array 200 of FIG. 2. For example, memory array 300 is illustrated as a 2×4 array with 8 STT-MRAM bit cells disposed along 2 rows and 4 columns. Each STT-MRAM bit cell includes 1MTJ storage element and 2 NMOS transistors (2T-1MTJ).

The following discussion of modifications to a bit cell is made with reference to an exemplary SIT-MRAM bit cell 308 within the memory array 300. To achieve a high performance configuration, connections to MTJ storage element 302 and bit line BL1 through node 314 are severed. Likewise, the connections to MTJ storage element 302 are severed and MTJ storage element 302 is no longer connected to NMOS transistor 304. Hence MTJ storage element 302 is a dummy cell which is no longer part of STT-MRAM bit cell 308. MTJ storage element 302 is merely illustrated in FIG. 3 to indicate that MTJ storage element 302, while physically present in memory array 300, is electrically decoupled or isolated from the rest of the circuit, and may be ignored for the purposes of operation of the memory array 300. It will be appreciated that severing the electrical connections of MTJ storage element 302 may be accomplished by a variety of techniques. For example, a metal layer change during the fabrication of memory array 300 may be used. For example, if the connections to MTJ storage elements such as MTJ storage element 302 were made in a particular metal layer, then by making appropriate changes to the mask during metallization of the layer, the connections may be removed, thus isolating MTJ 302 from the memory array.

In another aspect, metal lines 306 and 307 may be formed such that NMOS transistors 324 and 304 may be connected in parallel to MTJ storage element 322. Further, node 314 is optionally short-circuited to node 316, as illustrated in FIG. 3. It will be appreciated that these modifications can effectively configure STT-MRAM bit cell 308 to operate as a 2T-1MTJ bit cell. Again, metal lines 306 and 307 may be formed by making appropriate changes to one or more masks (relative to a standard HD masks) during metallization/fabrication of the memory array in a semiconductor device.

To help ensure that both NMOS transistors 324 and 304 are activated to operate in parallel, word lines WL0a and WL1b can be activated simultaneously during a read or write operation of the 2T-1MTJ STT-MRAM bit cell 308. FIG. 3 also illustrates an exemplary configuration to activate both word lines (e.g., WL0a and WL1b) via a single word line control signal on a common word line (e.g., WL1), according to at least one embodiment. Multiplexer 310 can be configured to drive the control signal (logic value) carried by word line WL1 on to word line WL0a in the HP mode (e.g., as determined by the mode signal). In the HD mode, multiplexer 310 may simply propagate the logic value driven by the address decoder on word line WL0. Logic gate 312 is a buffer configured to balance the delay and drive strength of multiplexer 310. It will be appreciated that logic multiplexer 310 and logic gate 312 can be consider logic configured to selectively couple two or more word lines (e.g., WL0a and WL1b) to a common word line control line WL1). In the illustrated embodiment, the multiplexer 310 has inputs coupled to the common word line control line (e.g., WL1) and a second word line control line (e.g., WL0) and an output coupled to a first word line (WL0a) of the two or more word lines. The buffer 312 has an input coupled to the common word line control line (e.g., WL1) and an output coupled to a second word line (e.g., WL1b) of the two or more word lines. Further, it will be appreciated that other logic elements can be used to achieve the functionality of the elements described herein and the specific illustration of FIG. 3 should not be construed as limiting the various embodiments.

When STT-MRAM bit cell 308 is selected for a read or a write operation, word line WL1 can be activated by the address decoder. It will be appreciated that a compiler associated with a test chip for testing memory array 300 in the HP mode may be configured to select only addresses associated with odd-numbered word lines, such as WL1 and WL3. Correspondingly, WL0a is also activated by the operation of multiplexer 310. Bit selector 330 activates bit line BL1 and source line SL1 in accordance with the address decoder and couples selected bit line BL1 and source line SL1 to common bit line 335 and common source line 337, which in turn is coupled to the common write driver 340 during write operations or common read sense amplifier 350 during read operations. Likewise, during operation the addressing scheme can be configured to activate alternating word lines (e.g., only odd or even word lines) that are configured to be simultaneously activated. NMOS transistors 324 and 304 connected in parallel, supply current to, or draw current from MTJ storage element 322. Since NMOS transistors 324 and 304 are connected in parallel, they provide a low resistance path which enables increased current flow across the MTJ storage element 322. This configuration can provide improved switching activity and higher performance than the single transistor configuration.

According to the exemplary embodiments discussed above, by making changes to a one or more metal layers (via mask and/or subsequent processing) and adding logic gates such as multiplexers and buffers, a similar database used to create a conventional HD memory array can be configured into memory array 300 which can be used for HP configurations.

In another exemplary embodiment, memory array 300 may be configured to operate in the HD (1T-1MTJ) mode by activating word line WL1 and deactivating WL0. This can be accomplished by setting multiplexer 310 to the HD mode to transmit the address decoder value corresponding to WL0 to WL0a, and ensuring that the compiler is configured to select only odd-numbered word lines such as WL1 and WL3. By activating WL1 and deactivating word line WL0 in memory array 300, NMOS transistor 304 in STT-MRAM bit cell 308 is turned off and NMOS transistor 324 is turned on when the bit selector 330 activates bit line BL1 and source line SL1. Accordingly, the STT-MRAM bit cell 308 is effectively transformed into a 1T-1MTJ structure in this mode of operation. It will also be appreciated that similar functionality can be achieved by activating WL0 and deactivating WL1. In this configuration in the HD mode, transistor 324 will be deactivated and transistor 304 coupled to MTJ storage element 322 will selectively be activated. The addressing logic for this configuration would be configured to select the even word lines (WL0, WL2, etc.). Using either sequence of word line selections previously discussed, the memory array 300 configured to test HP applications may also be configured to test HD applications by controlling the operation of multiplexer 310 and the selection of the enabled word lines.

The logic values on word lines WL0a and WL1b, respectively, for the HD (1T-1MTJ) and HP (2T-1MTJ) modes in memory array 300 as illustrated in FIG. 3 are provided in Table 1, below.

TABLE 1

| nT-1MTJ | WL0a | WL1b | Mode |
|---|---|---|---|
| n = 1 (1T-1MTJ) | WL0 | WL1 | HD |
| n = 2 (2T-1MTJ) | WL1 | WL1 | HP |

Figure 4:
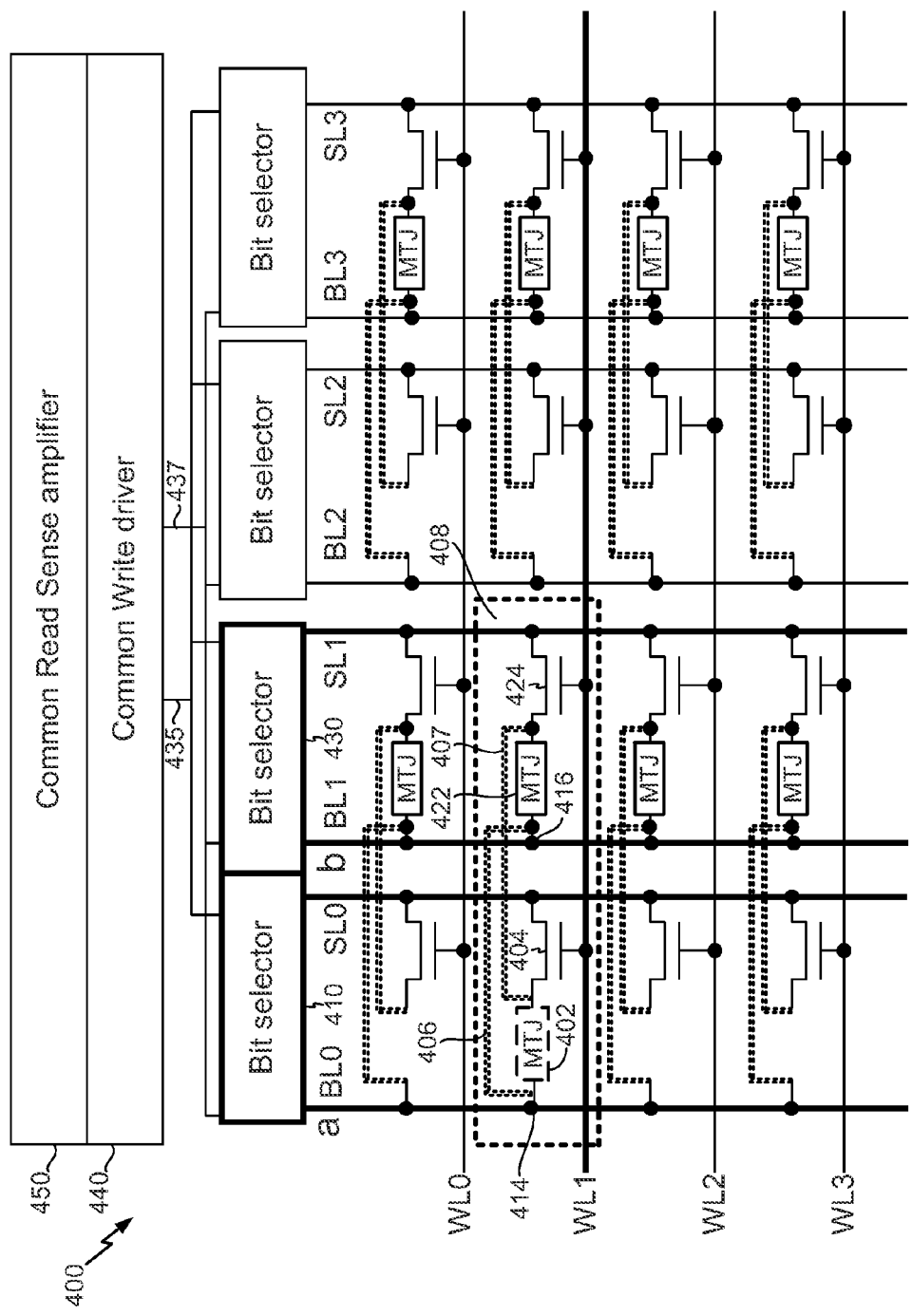
FIG. 4 is a 4×2 STT-MRAM array with 8 STT-MRAM bit cells disposed along 4 rows and 2 columns, and configured to operate in a high performance mode.

FIG. 4 illustrates yet another exemplary embodiment, wherein a test chip/memory array may be configured to test both HD and HP configurations using a single database. Memory array 400 is illustrated as a 4×2 memory array with 8 STT-MRAM bit cells disposed along 4 rows and 2 columns. Similar to memory array 300 of FIG. 3, memory array 400 may be derived from a similar database as used to form conventional HD memory array 200 of FIG. 2. The reconfiguration can be made using metal layer/connection option changes. These option changes can include severing connections to dummy MTJ storage elements (e.g., MTJ storage element 402) and adding metal lines (e.g., 406 and 407) to reconnect the bit cells, for example, as illustrated in FIG. 4. These changes may be accomplished by making appropriate modifications to the masks used during metallization/fabrication of the various metal layers of the semiconductor device containing the memory array 400.

Similar to the formation of the STT-MRAM bit cell 308, STT-MRAM bit cell 408 is formed by connecting two transistors in parallel to an MTJ storage element, to form a 2T-1 MTJ structure. In contrast to STT-MRAM bit cell 308, the two transistors in STT-MRAM bit cell 408 are disposed along the same row but in different columns. Metal line 406 creates a short-circuit between nodes 414 and 416, which in turn makes sure both nodes are at the same potential. Likewise, metal line 407 connects NMOS transistors 424 and 404 in parallel and both are coupled to MTJ storage element 422. By activating word line WL1 (activating NMOS transistors 424 and 404) in conjunction with bit selectors 430 and 410, both are tied to common bit line 435 and common source line 437, which in turn is coupled to the common write driver 440 during write operations or common read sense amplifier 450 during read operations. Accordingly, the same values are on bit lines BL0 and BL1 and same values are on source lines SL0 and SL1. Since the two NMOS transistors 424 and 404 are connected in parallel to MTJ storage element 422, they provide a low resistance path for the current flow across MTJ storage element 422. Accordingly, a HP configuration can be realized by rearranging a conventional HD configuration, to provide for parallel activation of bit selectors in combination with parallel transistors coupled to a single storage element. Once again, it will be appreciated that the embodiments can be expanded to cover more than a two transistor to one storage element configuration.

Bit selectors 430 and 410 may be simultaneously activated in response to an address used to enable bit selector 430, by using a multiplexer mechanism similar to multiplexer 410 or by any appropriate logic to achieve similar functionality. For example, the addressing scheme/bit selector logic may be configured to simultaneously activate at least two bit lines of adjacent columns (e.g., BL0 and BL1) and at least two source lines of adjacent columns SL0 and SL1).

In one embodiment, during a write operation, multiplexer logic and/or addressing logic may be used to drive logic value "b", carried on bit line BIL1 on to bit line BL0 (e.g., a=b) for HP applications. Correspondingly, the complementary value of logic b may be driven on source lines SL1 and SL0, as the source lines have a logic value that is generally complementary to the logic value on their respective bit lines. Word line WL1 can be activated in response to the address decoder as described previously and known in the art. It will be appreciated that with the aforementioned modifications to a HD memory array (e.g., memory array 200), the bit cells in STT-MRAM memory array 400 can be configured to operate in a HP (2T-1MTJ) mode.

The logic values "a" and "b" that need to be driven on bit lines BL0 and BL1 respectively, for the HD and HP modes in memory array 400, are provided in Table 2, below. Once again, it will be appreciated that the logic values discussed herein are solely for explanation and not limitation of the various embodiments and changes, such as selecting BL0 for both modes with appropriate changes to the addressing can be accomplished according to the various embodiments.

TABLE 2

| nT-1MTJ | a | b | Mode |
|---|---|---|---|
| n = 1 (1T-1MTJ) | BL0 | BL1 | HD |
| n = 2 (2T-1MTJ) | BL1 | BL1 | HP |

Figure 5:
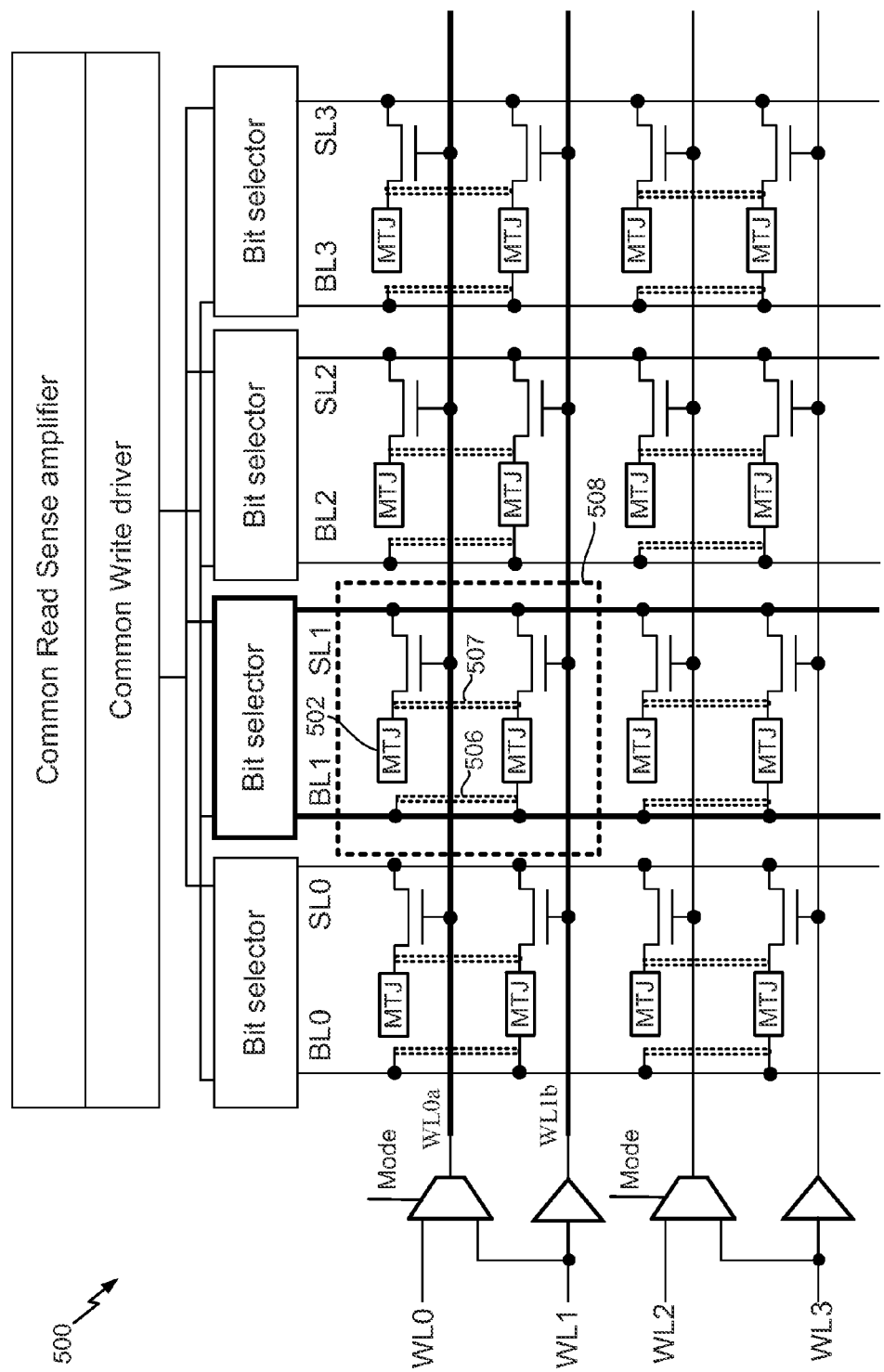
FIG. 5 is a 2×4 STT-MRAM array with 8 STT-MRAM bit cells disposed along 2 rows and 4 columns, and configured to operate in a high performance mode, with partially connected dummy MTJ storage elements.

Yet another exemplary embodiment is depicted in FIG. 5, where the memory array 500 is configured to operate in HP mode, with metal connections similar to memory array 300 including parallel connections (e.g., 506 and 507 of bit cell 508). Partially connected dummy MTJ storage elements (e.g., 502) are built into the database, as illustrated in FIG. 5, to achieve a good production margin. The exemplary memory array 500 may be configured to operate in HD mode by completing the connections to dummy MTJ storage elements using metal or via optional connections. Alternately, the memory array 500 may be configured to operate in HD mode, by using logic gates like multiplexers, and by restricting the compiler to access only alternating word lines (e.g., odd-numbered word lines such as WL1 and WL3). It will be appreciated that the latter technique for configuring memory array 500 to operate in HD mode may utilize approximately half the number of rows (e.g., corresponding to odd-numbered word lines), as the former technique using metal and/or via options (where both odd and even-numbered word lines are accessible).

Additionally, it will be appreciated that the various optional connections illustrated herein are provided solely for illustration and not limitation. For example, the severed connections do not have to necessarily be severed on both sides of an element and/or on any particular element, no long as the functional decoupling isolation is achieved. Likewise, the embodiments are not limited to the various illustrated configurations to couple elements in parallel, so long as the disclosed functional connection is achieved (e.g., two transistors in parallel with a storage element). Further, it will be appreciated whether the storage elements of the memory array are formed electrically connected and then severed or formed with dummy storage elements. Accordingly, the end configuration has a first subset of storage elements that are electrically decoupled from the memory array and a second subset of storage elements that are coupled to at least two transistors of the memory array.

Figure 6:
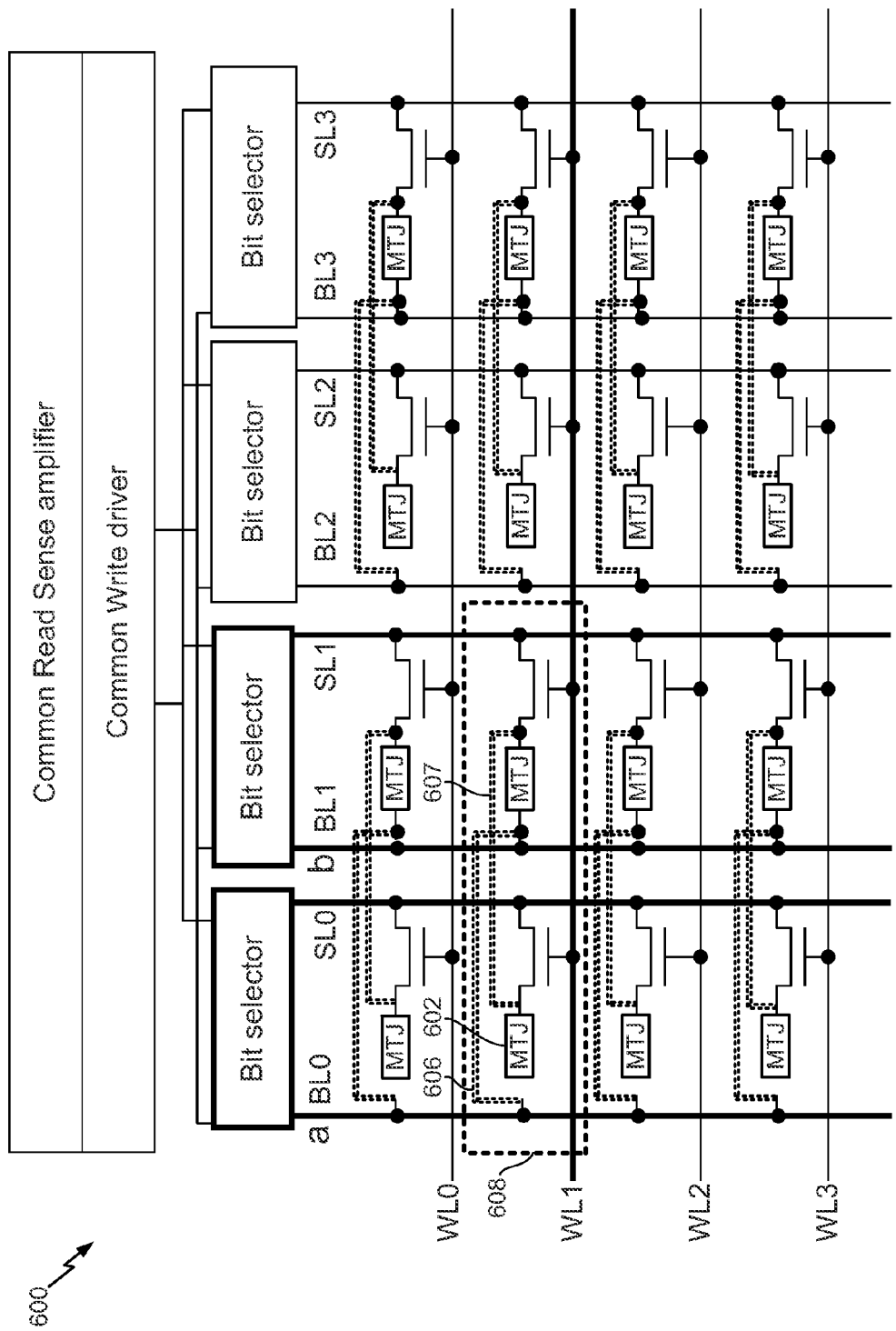
FIG. 6 is a 4×2 STT-MRAM array with 8 STT-MRAM bit cells disposed along 4 rows and 2 columns, and configured to operate in a high performance mode, with partially connected dummy MTJ storage elements.

FIG. 6 illustrates yet another exemplary embodiment. Memory array 600 is developed with metal connections similar to memory array 400. As shown in FIG. 6, memory array 600 is configured to operate in the HP mode including parallel connections (e.g., 606 and 607 of bit cell 608). As in the previously described embodiment, partially connected dummy MTJ storage elements (e.g., 602) can be built into the database. Metal or via options (e.g., optional connections) may be used to complete the connections to the dummy MTJ storage elements and thus configure memory array 600 to operate in the HD mode, along with appropriate addressing of the word line and bit selector and isolation of the parallel connections.

It will be appreciated that employing the techniques herein can provide significant savings in time and cost of development and testing of various memory arrays. For example, a database configured to test high density STT-MRAM arrays may be reconfigured to test high performance STT-MRAM arrays by utilizing the techniques and configurations disclosed herein. Likewise, a database configured for high performance STT-MRAM arrays may be reconfigured for high density STT-MRAM arrays. Switching between high density and high performance modes may be achieved by techniques such as, making changes to metal and/or via options (different masks/fabrication operations), post fabrications options (e.g., fuse options to sever connections); configuring external pins; utilizing logic gates such as multiplexers and buffers; and/or setting compiler options to restrict access to specific memory locations.

Additionally, although the foregoing discussion of STT-MRAM cells and devices has been presented herein, it will be appreciated that the various embodiments are not limited to specific memory types. For example, it will also be appreciated that the techniques disclosed herein, can be extended to resistive RAM arrays such as Magnetoresistive Random Access Memory (MRAM). Resistive-RAM (RRAM) and Phase Change RAM (PRAM, PCRAM).

Figure 7:
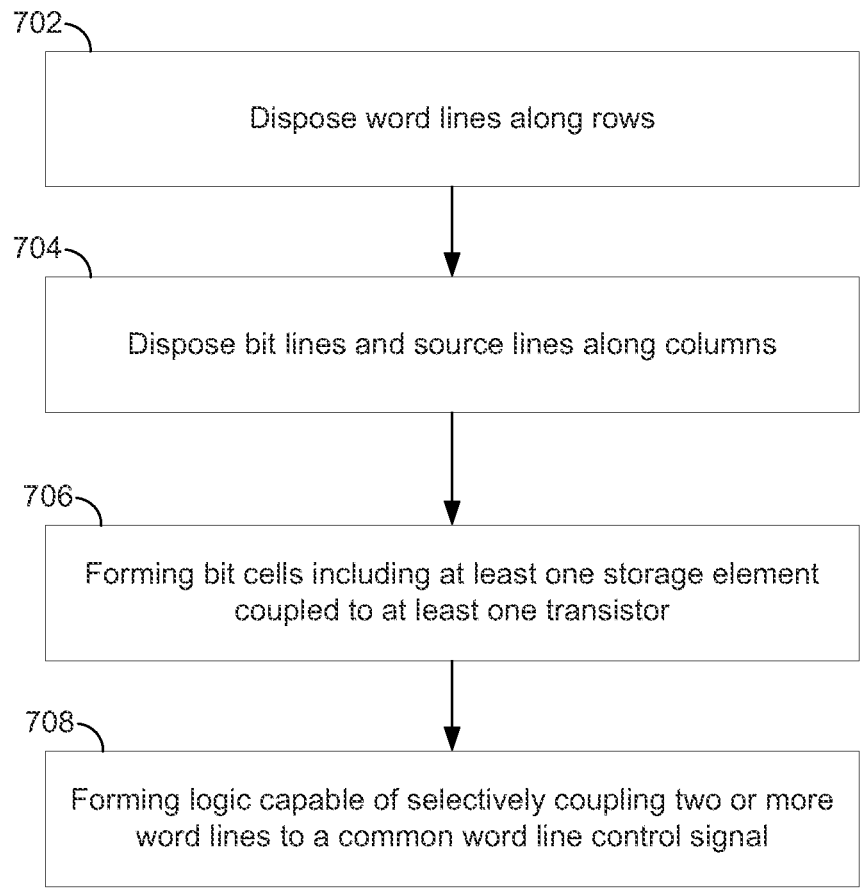
FIG. 7 illustrates a method of forming a configurable memory array according to an exemplary embodiment.

It will be appreciated that embodiments include various methods for performing the processes, functions and/or algorithms disclosed herein. For example, as illustrated in FIG. 7, an embodiment can include a method of forming a configurable memory array including disposing word lines along a row direction (block 702). At block 704, disposing bit lines and source lines along a column direction. Next, at block 706, bit cells including at least one storage element (e.g., magnetic tunnel junction (MTJ) storage element), coupled to at least one transistor. Proceeding to block 708, logic capable of selectively coupling two or more word lines to a single word line control signal is formed. It will be appreciated that the illustrated flowchart is merely to facilitate a discussion of the various embodiments. However additional subject matter/functions disclosed herein may be reduced to various methods not explicitly illustrated, which are encompassed within the various embodiments disclosed herein.

Figure 8:
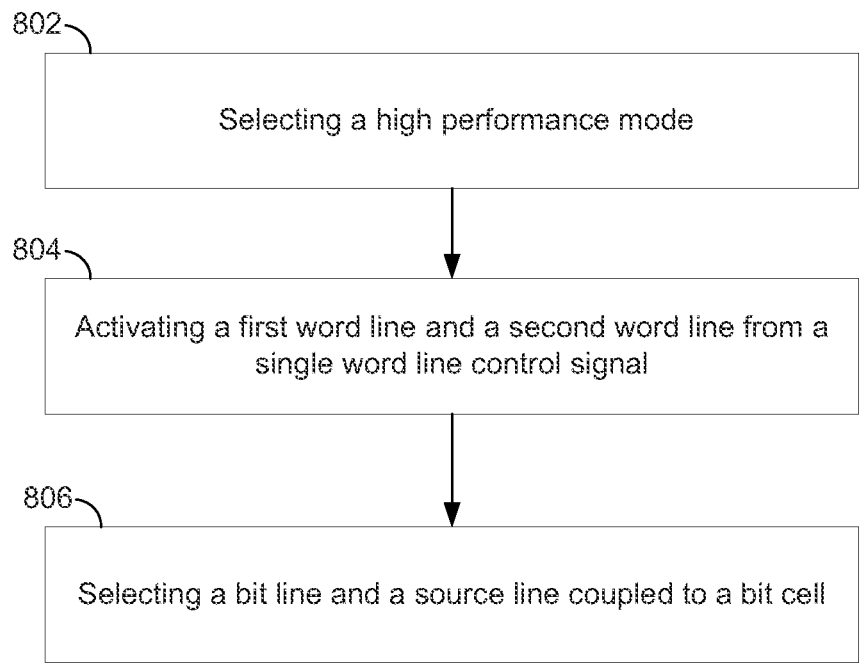
FIG. 8 illustrates a method of testing a memory array according to an exemplary embodiment.

For example, it will be appreciated that embodiments can include a method of testing a memory array as illustrated in FIG. 8. For convenience of illustration, some of the actions will be related to elements of FIG. 3. However, the embodiments are not limited to the elements of FIG. 3. A high performance mode can be selected (e.g., via multiplexer 310) in block 802. A first word line (e.g. WL0a) and a second word line (e.g. WL1b) can be activated from a single word line control signal (e.g. on WL1), in block 804. The first word line can be coupled to a first transistor (e.g. 304) and the second word line can be coupled to a second transistor (e.g. 324) and each transistor can be coupled to a storage element (e.g. 322). A hit line (e.g., BL1) and a source line (e.g. SL0) coupled to a bit cell (e.g. 308) is selected, in block 806. The bit cell includes the storage element and the first transistor and the second transistor. Selecting the high performance mode can be accomplished by selecting a first input of a multiplexer. The first input being coupled to the single word line control signal (e.g., WL1) and an output of the multiplexer being coupled to the first word line (e.g., WL0a).

Figure 9:
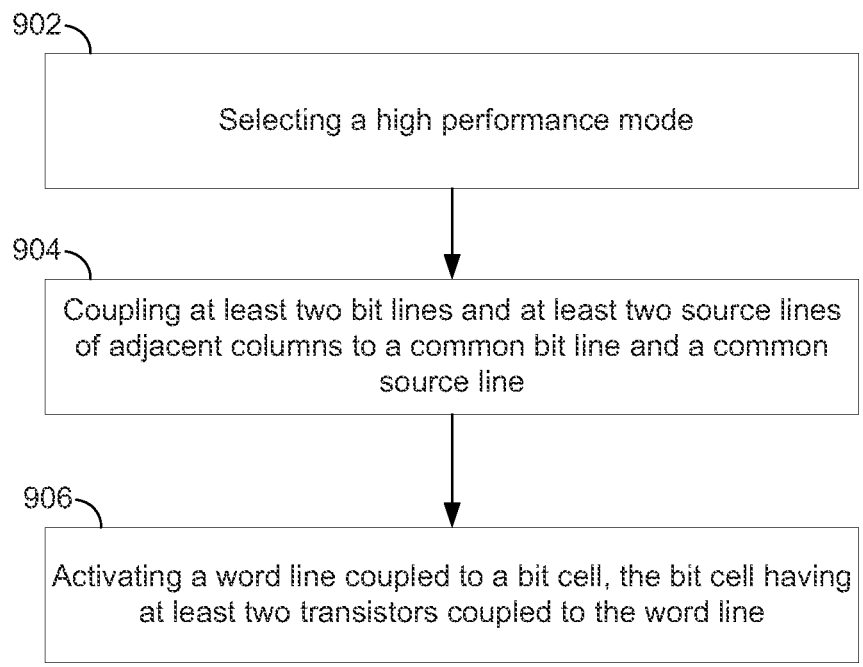
FIG. 9 illustrates a method of testing a memory array according to another exemplary embodiment.

Yet another embodiment can include a method of testing a memory array as illustrated in FIG. 9. For convenience of illustration, some of the actions will be related to elements of FIG. 4. However, the embodiments are not limited to the elements of FIG. 4. Once again, a high performance mode can be selected, in block 902. In block 904, at least two bit lines (e.g., BL0 and BL1) and at least two source lines (e.g., SL0 and SL1) of adjacent columns are coupled to a common bit line (e.g., 435) and a common source line (e.g., 437) tied to the common write driver 440 and/or sense amplifier 450, respectively. A word line (e.g., WL1) coupled to a bit cell having at least two transistors (e.g., 404 and 424) coupled to the word line can be activated, in block 904. Each transistor can be coupled to one of the at least two source lines and a storage element (e.g., MTJ 422). The storage element can be coupled to the at least two bit lines. Accordingly, in the high performance mode, the storage element has at least two transistors coupled in parallel coupled to the storage element to reduce the effective resistance in series with the storage element.

It will be appreciated that memory devices including the MTJ storage elements described herein may be included within a mobile phone, portable computer, hand-held personal communication system (PCS) unit, portable data units such as personal data assistants (PDAs), GPS enabled devices, navigation devices, settop boxes, music players, video players, entertainment units, fixed location data units such as meter reading equipment, or any other device that stores or retrieves data or computer instructions, or any combination thereof. Accordingly, embodiments of the disclosure may be suitably employed in any device which includes active integrated circuitry including memory having MTJ storage elements as disclosed herein.

The foregoing disclosed devices and methods can be designed and can be configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Accordingly, embodiments can include machine-readable media or computer-readable media embodying instructions which when executed by a processor transform the processor and any other cooperating elements into a machine for performing the functionalities described herein as provided for by the instructions.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of the embodiments may be described or claimed in the singular, the plural is contemplated unless limitation to the singular is explicitly stated.

What is claimed is:

1. A memory array comprising:
    a plurality of bit lines and a plurality of source lines disposed in columns;
    a plurality of word lines disposed in rows;
    a plurality of storage elements having a first subset of storage elements electrically decoupled from the memory array and a second subset of storage elements coupled to the memory array;
    a plurality of bit cells, each bit cell including one storage element from the second subset of storage elements coupled to at least two transistors, wherein the plurality of bit cells are coupled to the plurality of bit lines and the plurality source lines, and wherein each transistor is coupled to one word line; and
    logic to selectively couple at least two bit lines and at least two source lines of adjacent columns to a common bit line and a common source line, respectively.

2. The memory array of claim 1, further comprising:
    logic configured to selectively couple at least two word lines to a common word line, and
    wherein each of the at least two transistors is coupled to one of the at least two word lines.

3. The memory array of claim 2, wherein the at least two transistors are coupled to one source line.

4. The memory array of claim 2, wherein the logic comprises:
    a multiplexer having an input coupled to the common word line and an output coupled to a first word line of the at least two word lines; and
    a buffer having an input coupled to the common word line and an output coupled to a second word line of the at least two word lines.

5. The memory array of claim 1, wherein electrical connections between storage elements of the first subset of storage elements and the plurality of bit lines are severed.

6. The memory array of claim 1, further comprising:
    metal lines and/or vias configured to transform the memory array from a high density configuration to a high performance configuration.

7. The memory array of claim 1, wherein the plurality of storage elements are non-volatile storage elements.

8. The memory array of claim 7, wherein the plurality of storage elements are magnetic tunnel junction (MTJ) storage elements.

9. The memory array of claim 1, wherein the memory array is integrated in at least one semiconductor die.

10. The memory array of claim 1 integrated in a device, the device selected from a group consisting of a set top box, music player, video player, entertainment unit, navigation device, communications device, personal digital assistant (PDA), fixed location data unit, and a computer.

11. The memory array of claim 1, wherein the at least two transistors are coupled to one word line and each transistor is coupled to one of the at least two source lines.

12. The memory array of claim 1, wherein the logic is further configured to activate only one of the at least two source lines.

* * * * *